(12) United States Patent
Lee

(10) Patent No.: US 7,275,905 B2
(45) Date of Patent: Oct. 2, 2007

(54) METHOD AND DEVICE FOR CONTROLLING POSITION OF CASSETTE IN SEMICONDUCTOR MANUFACTURING EQUIPMENT

(75) Inventor: Jong-Haw Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 243 days.

(21) Appl. No.: 11/105,360

(22) Filed: Apr. 14, 2005

(65) Prior Publication Data

US 2005/0262716 A1  Dec. 1, 2005

(30) Foreign Application Priority Data

May 17, 2004 (KR) .................. 10-2004-0034724

(51) Int. Cl.
*B65G 49/07* (2006.01)

(52) U.S. Cl. .............. 414/217; 414/217.1; 414/940

(58) Field of Classification Search ........... 414/935, 414/936, 937, 938, 939, 940, 941, 217, 217.1, 414/227.02; 33/613; 198/345.1, 345.3
See application file for complete search history.

(56) References Cited

U.S. PATENT DOCUMENTS

| | | | | |
|---|---|---|---|---|
| 5,645,391 A | * | 7/1997 | Ohsawa et al. | 414/937 |
| 5,970,621 A | | 10/1999 | Bazydola et al. | |
| 6,178,361 B1 | * | 1/2001 | George et al. | 414/217 |
| 6,186,723 B1 | * | 2/2001 | Murata et al. | 414/217 |
| 6,775,918 B2 | * | 8/2004 | Tseng et al. | 414/940 |
| 7,074,000 B2 | * | 7/2006 | Englhardt | 414/217.1 |

\* cited by examiner

*Primary Examiner*—James R. Bidwell
(74) *Attorney, Agent, or Firm*—Volentine & Whitt, PLLC

(57) ABSTRACT

A cassette position control device controls the position of a cassette in which wafers are stored, when the wafer cassette is loaded on a cassette support. In addition to the cassette support, the device has a cassette moving section and a control section. The control section senses the state of the wafer cassette on the cassette support, and generates and outputs a motor drive signal to move the cassette to a designated relative position on the cassette support. The cassette moving section moves the wafer cassette to the designated position in response to the motor drive signal. Therefore, wafers can be loaded/unloaded to and from the same designated position after the wafer cassette has been placed on a cassette support.

13 Claims, 6 Drawing Sheets

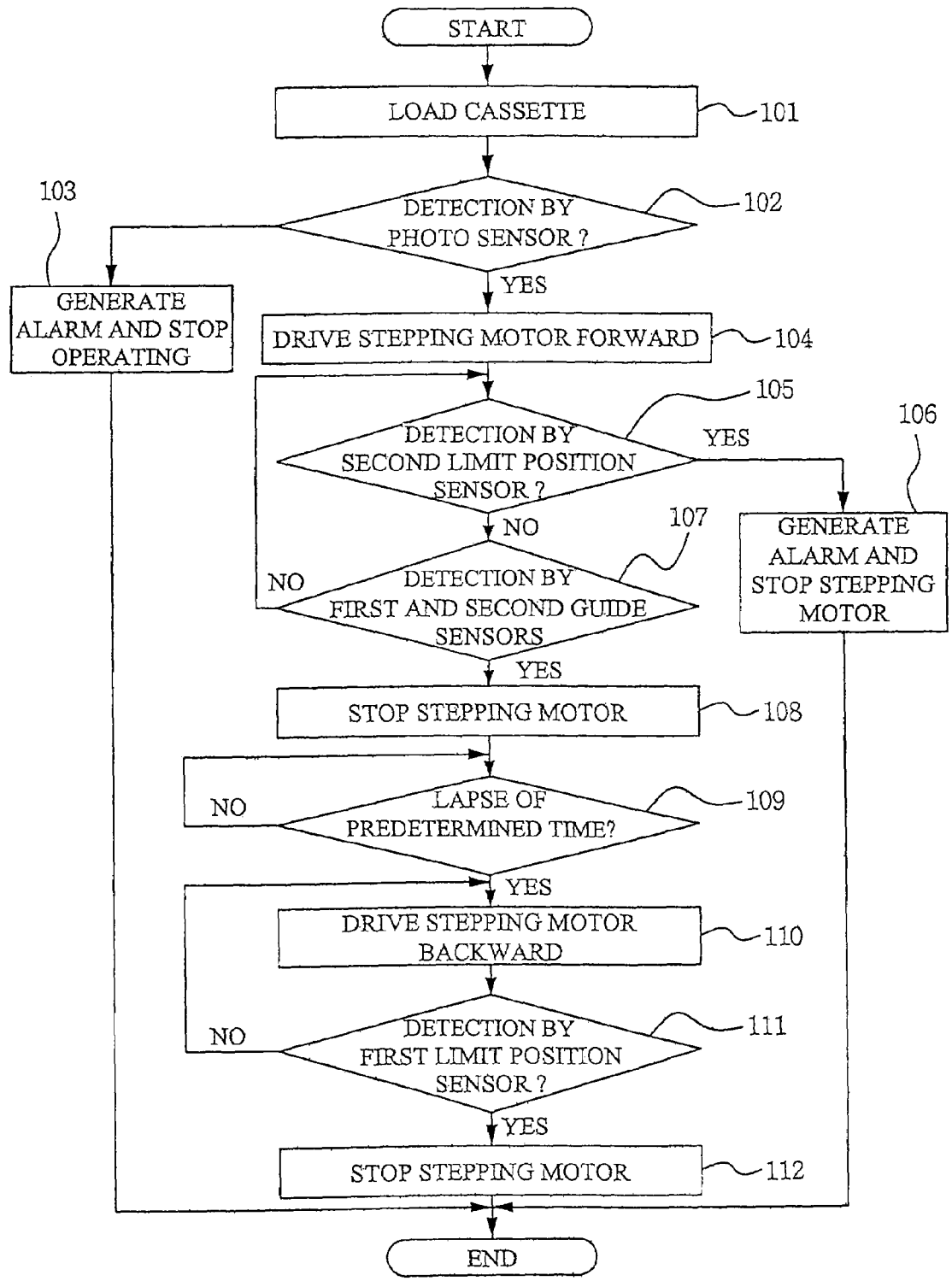

METHOD AND DEVICE FOR CONTROLLING POSITION OF CASSETTE IN SEMICONDUCTOR MANUFACTURING EQUIPMENT

BACKGROUND OF THE INVENTION

1. Field of the Invention

The present invention relates to semiconductor manufacturing equipment. More particularly, the present invention relates to a device for controlling the position of a cassette in which wafers are supported, after the cassette has been loaded on a cassette support.

2. Description of the Related Art

Semiconductor manufacturing equipment typically includes a robot for automatically transferring wafers one-by-one between a wafer cassette and a process chamber in which the wafers are processed. More specifically, the wafer cassette has slots for accommodating the wafers, respectively, and the wafer cassette itself is loaded onto a wafer cassette support. Each wafer is taken out of a respective slot of the wafer cassette and is transferred to the process chamber by the robot. Once the wafer is processed, the wafer is removed from the process chamber and then is returned to a slot of a wafer cassette by the robot. A detector installed in the wafer cassette support detects whether the wafer cassette is at a position which ensures that the wafers will be smoothly transferred by the robot. The detector uses a mechanical device, such as a contact switch, to physically detect for the presence of the wafer cassette at a predetermined location on the wafer cassette support.

However, a detector relying on a mechanical elements has a very limited operability. Accordingly, a wafer cassette support having a detector that can detect for the presence of a wafer cassette with a higher degree of reliability has been developed. Such a prior art wafer cassette support and detector, as well as the wafer cassette itself, will be described with reference to FIGS. 1 to 3.

The wafer cassette 2 has the general form of a box of which one side, e.g., the front, has an opening 2a through which wafers W are loaded into or are taken out of the cassette. The wafer cassette 2 also has a pair of opposing inner walls. Each of the inner walls is made up of a plurality of wafer support projections 3 spaced vertically one above the other. The wafer support projections 3 define a plurality of slots 4 sized to accommodate the wafers W, respectively. An outer peripheral part of a wafer W is supported by a pair of the wafer support projections 3 while the wafer is accommodated in one of the slots 4. The back of the wafer cassette 2 includes a pair of protrusions 5 that extend rearwardly of the cassette 2. The bottom of the wafer cassette 2 includes a horizontal protrusion 6 extending laterally (in a direction between the sides of the cassette having the protrusions 3).

The wafer cassette support 1 has a base plate 7 formed of stainless steel, aluminum or the like. Four position fixation guides 8 disposed on the base plate 7 guide the wafer cassette 2 to a certain position on the base plate 7. To this end, the upper portion of each position fixation guide 8 has a bevel 8a that easily guides the wafer cassette 2 as the cassette 2 is lowered onto the base plate 7. The bevels 8a also serve to prevent the wafer cassette 2 from being damaged as the wafer cassette 2 is placed on the base plate 7.

As shown best in FIG. 3, the position fixation guides 8 are adapted to respectively guide an inner wall surface F1 of a front left end part of the wafer cassette 2, an inner wall surface Fr of a front right end part of the wafer cassette 2, an inner wall surface R1 of a back left end part (left side protrusion 5) of the wafer cassette 2, and an inner wall surface Rr of a back right end part (right side protrusion 5) of the wafer cassette 2. As is clear form the figure, this arrangement of the position fixation guides 8 does not compromise the space efficiency of the base plate 7.

A cassette retainer 9 is disposed at the center of the base plate 7. The cassette retainer 9 defines a guide recess 10 sized to receive the horizontal protrusion 6 (FIG. 2) at the bottom of the wafer cassette 2. Movement of the wafer cassette 2 in forward and backward directions is restrained by the cassette retainer 9 when a wafer cassette 2 rests on the base plate 7 with the protrusion 6 received in the recess 10. On the other hand, the wafer cassette 2 can slide laterally as guided by the position fixation guides 8 while the protrusion 6 is received in the recess 10.

Two of the position fixation guides 8S disposed diagonally across from each other, namely the position fixation guides for guiding the front left end part of the wafer cassette 2 and the back right end part of the wafer cassette 2, each have a slit 11 through which light can pass. The slit 11 is in the form of a tunnel extending through the position fixation guide 8S and open at the lower surface of the position fixation guide 8S. Optical detection switches 12 are provided adjacent the two position fixation guides 8S, respectively. Each switch 12 is adapted to check whether a wafer cassette 2 is present at a certain position on the base plate 7.

In particular, each optical detection switch 12 includes a light emitting part 12A for emitting visible light, for example, and a light receiving part 12B for receiving light emitted by the light emitting part 12A. The light emitting part 12A may comprise a light-emitting diode (LED) or a laser diode, and the light receiving part 12B may comprise a photo diode (PD). The light emitting part 12A and the light receiving part 12B face each other across the slit 11 of a position fixation guide 8S. Thus, if a wafer cassette 2 rests on the base plate 7 but is not present at a predetermined position relative to the base plate 7, light from a light emitting part 12A passes through the slit 11 of a position fixation guide 8S and reaches the light receiving part 12B. On the other hand, if a wafer cassette 2 is present at the predetermined position relative to the base plate 7, the light from a light emitting part 12A passes through the slit 11 but is blocked by the wafer cassette 2, i.e., the light does not reach the light receiving part 12B. Also, when a gap exists between the wafer cassette 2 and the base plate 7 after the wafer cassette 2 has been loaded onto the base plate 7, light from a light emitting part 12A passes through a slit 11, under the wafer cassette 2 and then impinges the associated light receiving part 12B. Thus, the wafer cassette 2 is detected as not being at a predetermined position on the base plate 7.

Furthermore, beneficially, the light emitting part 12A is disposed adjacent the side of the position fixation guide 8S which is not used to guide the wafer cassette 2 onto the base plate 7. Conversely, the light receiving part 12B is disposed at the side of position fixation guide 8S having the bevel 8a, namely, the side used to guide the wafer cassette 2 onto the base plate 7, as spaced therefrom. In the case in which the light emitting part 12A comprises an LED, for example, light from the light emitting part 12A is not scattered and passes through the slit 11 with good efficiency because the light emitting part 12A is disposed close to the position fixation guide 8S.

Regardless of the precision offered by the optical detectors 12, the four position fixation guides 8 are fixed. Furthermore, the position fixation guides 8 do not abut the wafer cassette 2 when the cassette 2 is supported by the base plate 7; rather, gaps are present between the external walls of the cassette 2 and the position fixation guides 8 to allow for some latitude in the operation of setting the cassette 2 on the base plate 7. Therefore, the position of the wafer cassette 2 can change or shift whenever the wafer cassette 2 is placed on the base plate 7. Therefore, the wafer can be broken if the wafer cassette 2 is not positioned precisely relative to the base plate 7 when a cassette station (C/S) arm of the robot loads or unloads a wafer into or from the cassette 2.

SUMMARY OF THE INVENTION

Accordingly, an object of the present invention is to provide a cassette position control device that always places a wafer cassette at a desired position whenever a wafer cassette is loaded onto a base plate in semiconductor manufacturing equipment.

According to one aspect of the invention, a cassette position control device for use in semiconductor manufacturing equipment comprises a cassette support, a control section, and a cassette moving section. The control section senses a state of the wafer cassette after the cassette has been loaded on the cassette support and outputs a motor drive signal once a certain state of the wafer cassette has been sensed. The cassette moving section moves the wafer cassette to a designated position when the motor drive signal has been outputted from the control section.

The control section includes a position sensor situated relative to the base plate so as to sense whether a wafer cassette is at a stably supported position on the wafer cassette, and a controller operatively connected to the position sensor so as to generate and output the motor drive signal when the position sensor senses the presence of a wafer cassette at a stably supported position on the base plate. The cassette moving section includes a motor operatively connected to the controller so as output a driving force when the motor drive signal is received from the controller, and a movable first wafer cassette guide connected to the motor so as to be driven by the driving force output by the motor.

According to another aspect of the invention, in addition to the aforementioned first cassette guide, the cassette moving section of the cassette position control device comprises a stepping motor, a ball screw connected with the stepping motor, and an LM (Linear Movement) guide which is engaged with the ball screw so as to convert rotational movement of the ball screw into linear movement. The first cassette guide is fixed to the LM guide so as to move therewith.

In this case, the cassette support also includes a fixed second cassette guide disposed spaced from the first cassette guide in a forward direction of movement thereof. The second cassette guide serves to establish the designated position to which the wafer cassette is moved.

In addition, the control section may comprise a photo sensor for sensing whether the wafer cassette is stably positioned on the cassette support. The controller of the control section is operatively connected to the photo sensor for driving the stepping motor in a forward direction when the photo sensor senses that the wafer cassette is stably positioned on the cassette support. The control section preferably also includes a bracket that is fixed to the LM guide, first and second limit position sensors for respectively detecting forward and limit positions of the first cassette guide through the movement of the bracket, and at least one guide sensor integrated with the second cassette guide to detect when the wafer cassette arrives at the second cassette guide and contacts the same.

According to another exemplary aspect of the invention, a method of positioning a cassette for use in semiconductor manufacturing equipment comprises loading the wafer cassette onto the base plate of a wafer cassette support, and subsequently moving a first cassette guide in a forward direction relative to the base plate while the first cassette guide is engaged with the wafer cassette to thereby move the wafer cassette along the base plate to a designated position.

Preferably, the wafer cassette is moved along the base plate only after the wafer cassette is sensed as being stably positioned on the base plate. The cassette is moved by operating a stepping motor in a forward direction. The operation of the stepping motor is stopped once the presence of the wafer cassette at the designated position has been sensed. Subsequently, a counting operation is initiated and the stepping motor is operated in a backward direction after a predetermined period of time has elapsed to thereby return the cassette guide to an initial position.

BRIEF DESCRIPTION OF THE DRAWINGS

The present invention will become more fully understood from the detailed description of the preferred embodiments thereof that follows as made with reference to the accompanying drawings, wherein:

FIG. 6 is a flow chart of a method of controlling the positioning of a cassette according to the present invention.

DETAILED DESCRIPTION OF THE PREFERRED EMBODIMENTS

The present invention will now be described in detail with reference to FIGS. 4 to 6. For purposes of clarity, though, a detailed description of known functions and systems of the semiconductor manufacturing equipment to which the present invention relates has been omitted.

Figure 1:
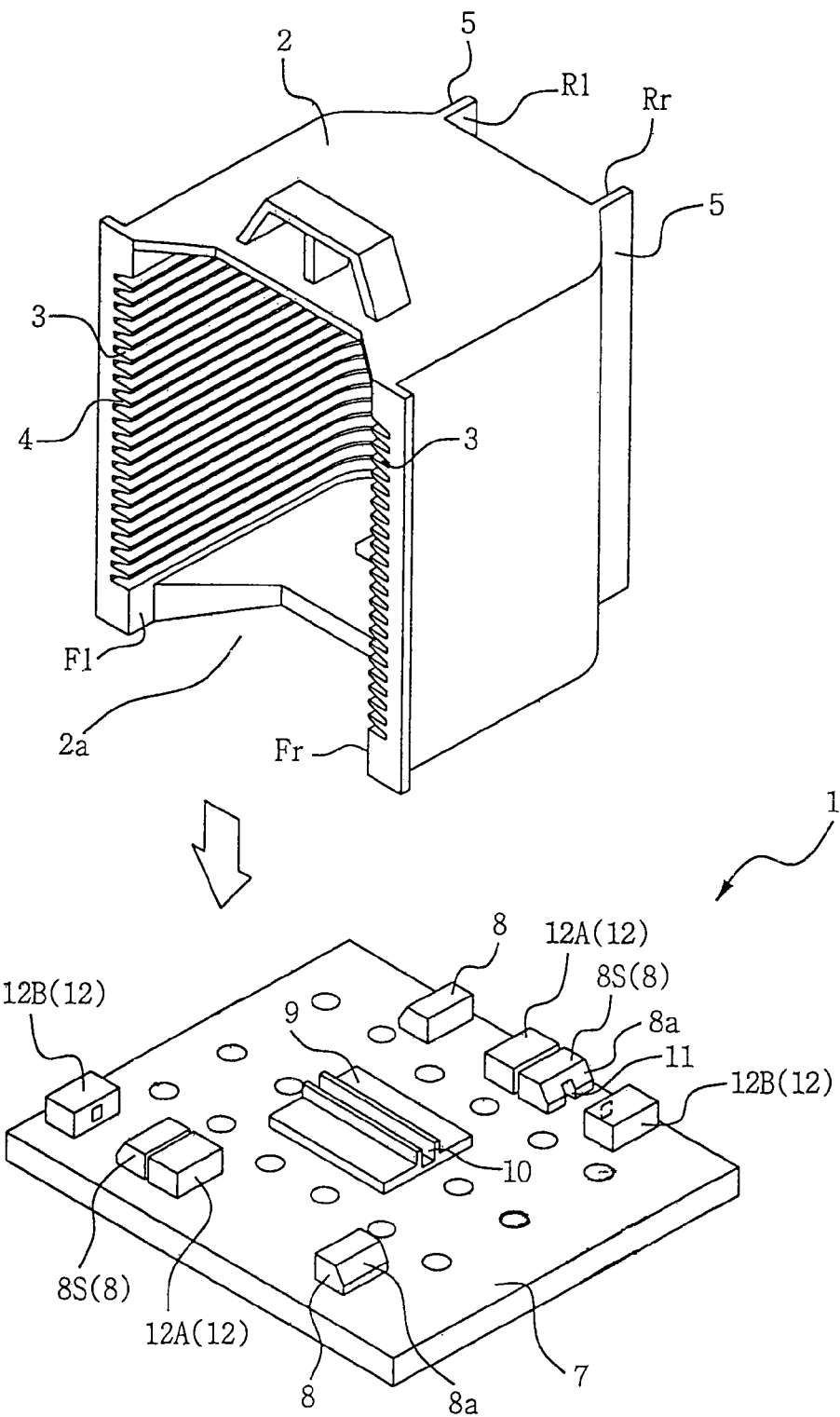
FIG. 1 is a perspective view of a prior art wafer cassette support and of a typical wafer cassette supported thereby.
Figure 2:
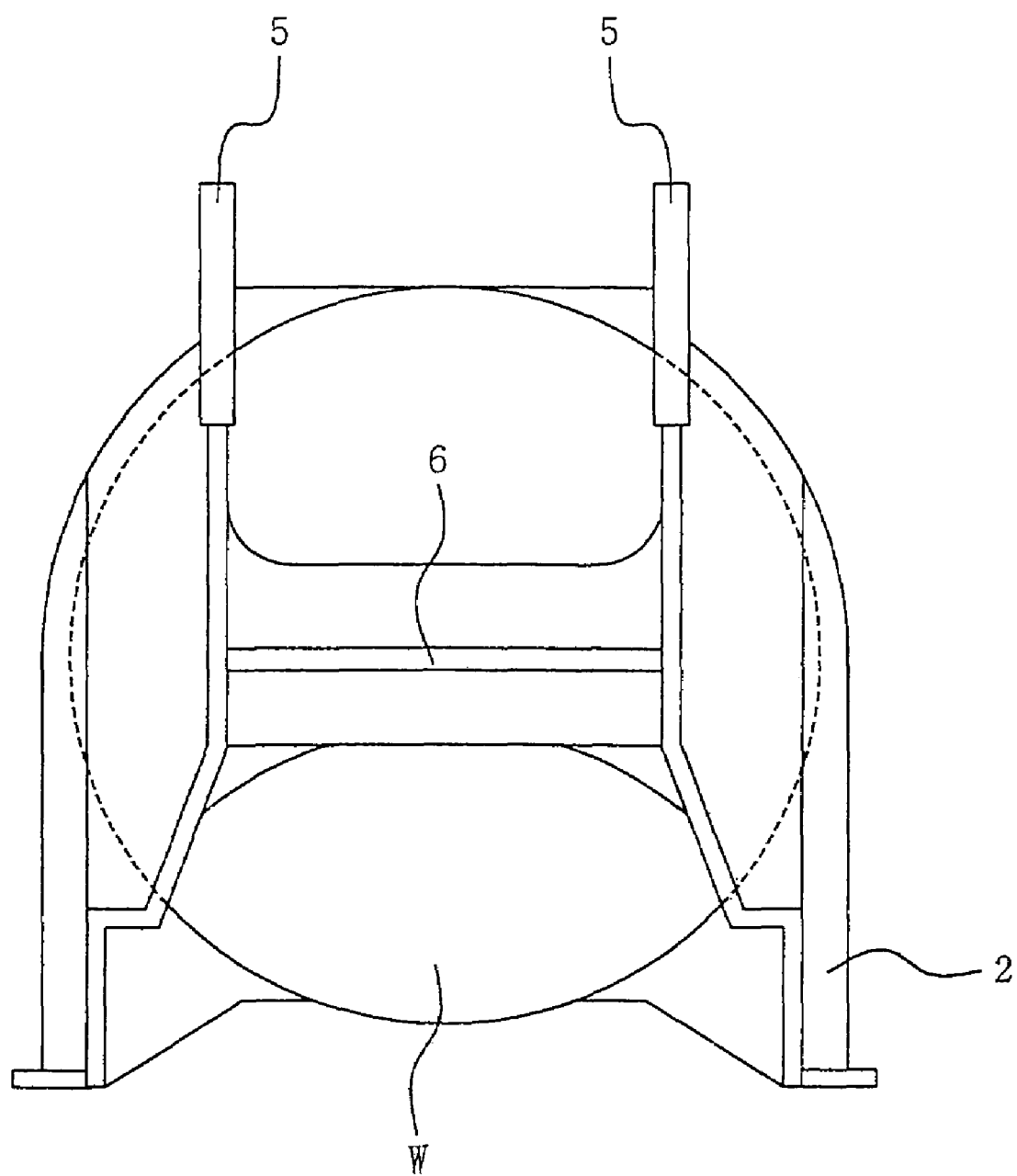
FIG. 2 is a bottom view of the wafer cassette shown in FIG. 1.
Figure 3:
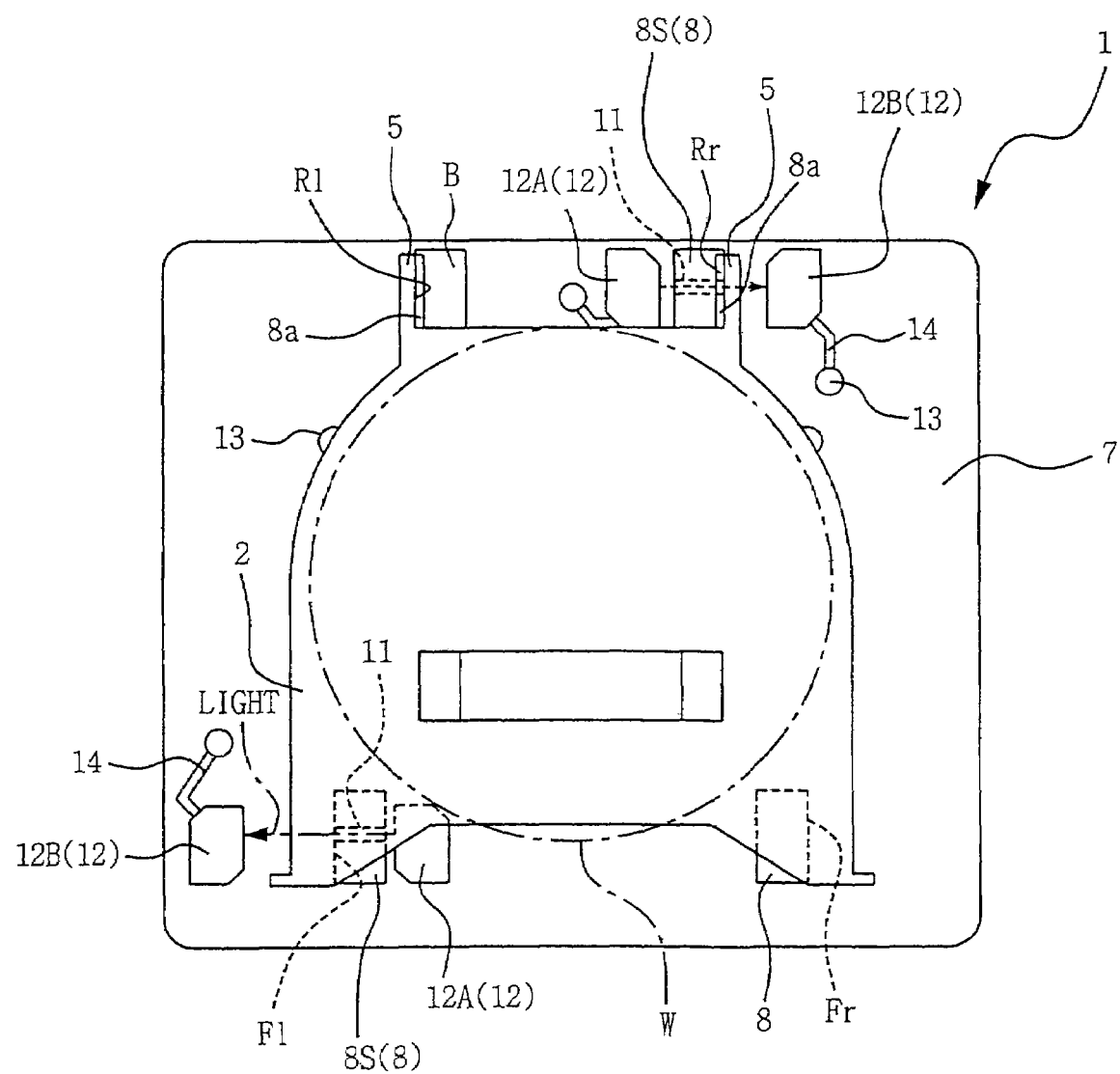
FIG. 3 is a plan view the wafer cassette support shown in FIG. 1 in a state in which a wafer cassette is disposed thereon.
Figure 4:
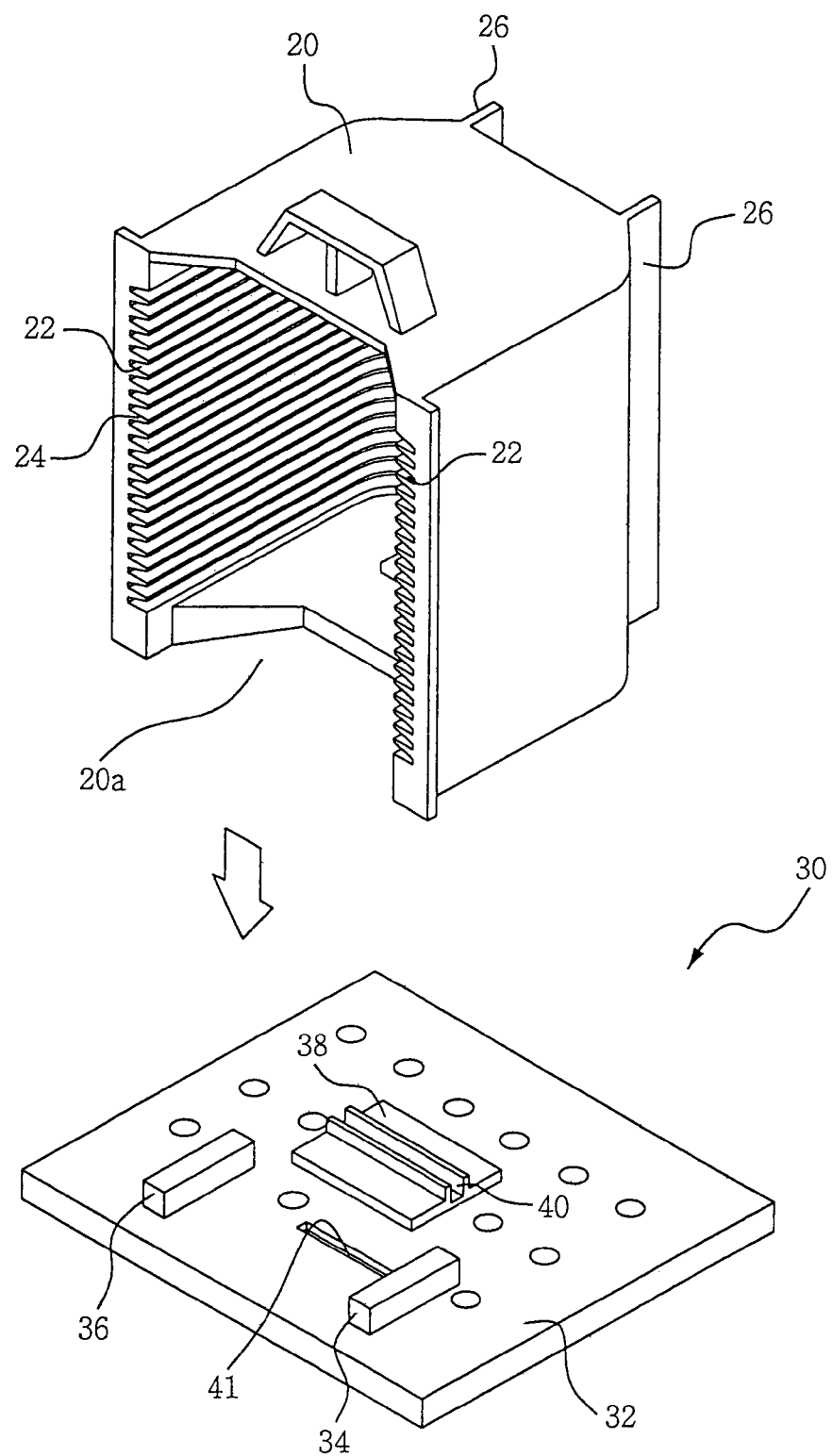
FIG. 4 is a perspective view of a wafer cassette, and of a wafer cassette position control device for use in aligning the cassette in semiconductor manufacturing equipment according to the present invention.

Referring first to FIG. 4, a wafer cassette 20 can accommodate a plurality of wafers. To this end, the wafer cassette 20 has essentially the same structure as that described in connection with FIG. 1. Briefly, then, the wafer cassette 20 has the general form of a box. One side of the cassette, e.g., the front, defines an opening 20a. Wafers W are inserted through or taken out of the cassette 20 through the opening 20a. The wafer cassette 20 also has a pair of inner side walls comprising a plurality of wafer support projections 22 spaced vertically from one another along each wall by uniform intervals. Thus, the wafer support projection parts 22 define a plurality of slots 24 therebetween. The outer peripheral edge of a wafer W is supported by an opposing pair of the wafer support projections 22 while the wafer W is accommodated in a respective one of the slots 24. The back of the wafer cassette 20, on the other hand, comprises a pair of protrusions 26. the bottom of the wafer cassette 20 includes a horizontal protrusion (60 in FIG. 5) extending laterally, i.e., in a direction between the sides of the cassette 20 having the projections 22.

A wafer cassette position control device for aligning the cassette, e.g., moving the cassette to a predetermined position relative to a transfer robot or the like, includes a cassette support 30 used to support the wafer cassette 20. The cassette support 30 has a base plate 32 formed of stainless, aluminum or the like. First and second cassette guides 34 and 36 are disposed on the base plate 32 to position a cassette 20 thereon. More specifically, the first cassette guide 34 is part of a cassette moving section of the device and is movable to guide a wafer cassette 20 against the second cassette guide 36 once the wafer cassette 20 has been placed on the cassette support 30. To this end, the base plate 30 has a guide slot 41 therein and along which the first cassette guide 34 can be moved toward and way from the second cassette guide 36. A third cassette guide 38 is disposed at a central portion of the base plate 32 to fix the wafer cassette 20 relative to the base plate 32. The center of the third cassette guide 38 defines a recess 40 into which the protrusion at the bottom of the wafer cassette 20 is inserted. Also, a photo sensor (62 in FIG. 5) is installed in a central portion of the guide flute 40 to detect whether the wafer cassette 20 is stably mounted to the cassette support 30. That is, the photo sensor senses whether the protrusion 60 of the wafer cassette 20 is properly received in the recess 40 of the third cassette guide such that the cassette 20 is stably supported by the base plate 32.

Figure 5:
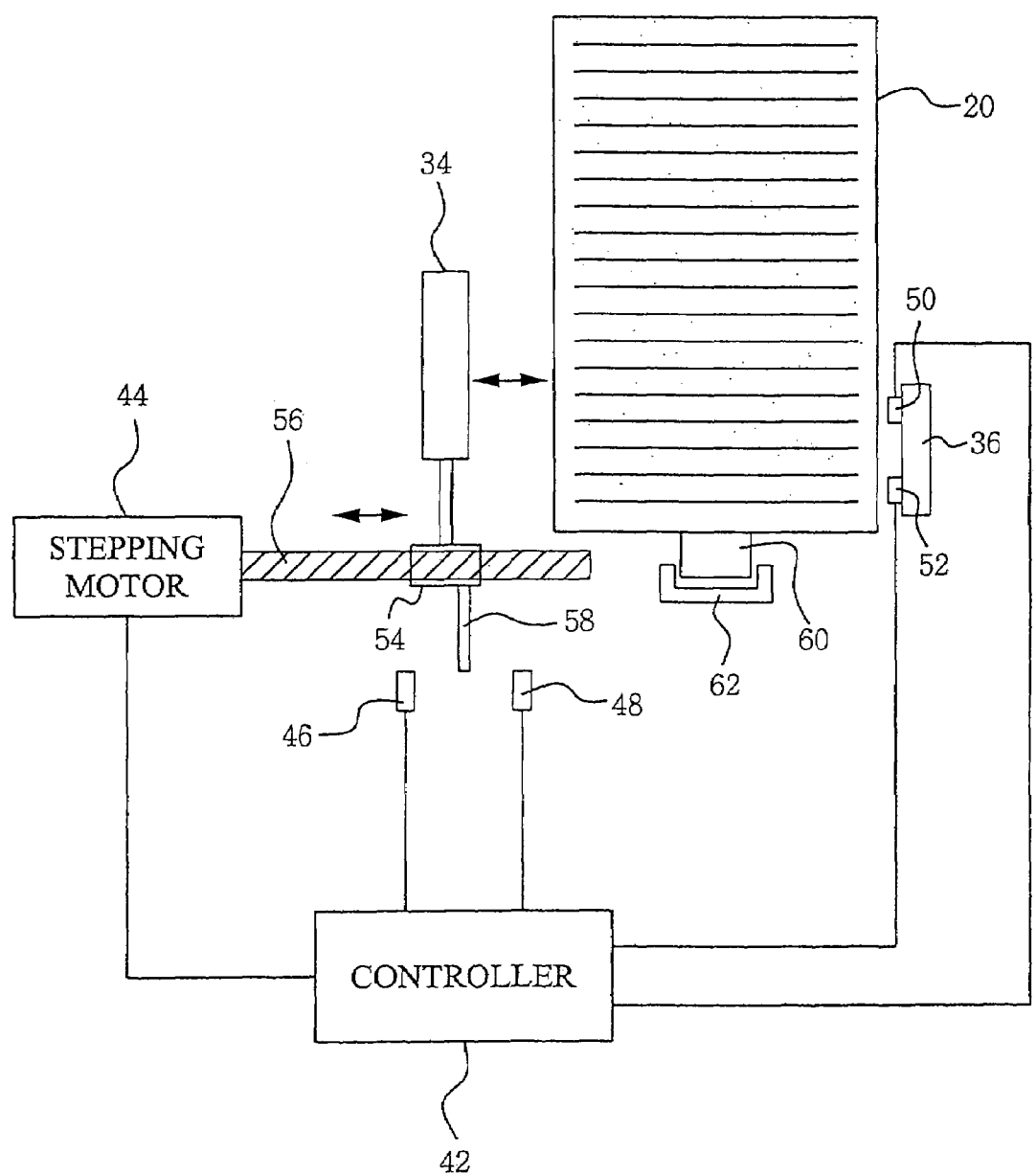
FIG. 5 is a schematic diagram of a cassette position control section of the wafer cassette position control device according to the present invention.

Referring to FIG. 5, in addition to the first cassette guide 34, the cassette moving section of the wafer cassette position control device also includes a stepping motor 44, a ball screw 56 connected to the stepping motor 44 so as to be rotated by the stepping motor 44, and an LM (Linear Movement) guide 54 through which the ball screw 56 extends as meshed therewith so as to convert rotation of the ball screw 56 into linear (horizontal) movement. The ball screw 56 extends in the direction of the guide slot 41 (FIG. 4) of the base plate 32 so that the LM guide 54 is driven by the ball screw 56 in the direction of the guide slot 41 when the stepping motor 44 is operating. The LM guide 54 is integrated with the first cassette guide 34 so that the first cassette guide 34 is moved in conformity therewith. The wafer cassette position control device also includes a bracket 58 that is fixed to the LM guide 54, and first and second limit position sensors 46 and 48 for detecting limit positions of the first cassette guide 34 through contact with the bracket 58. Furthermore, the device includes a controller 42, and first and second guide sensors 50 and 52 that are disposed on the second cassette guide 36 to detect whether the wafer cassette 20 is disposed against the second cassette guide 36. The first and second guide sensors 50 and 52 may comprise proximity sensors, pressure sensors or limit switches.

Basically, the controller 42 controls the stepping motor 44 to rotate the ball screw 56 in one (a forward) direction once the photo sensor 62 senses the presence of the guide protrusion 60 of the wafer cassette in the guide recess 40 of the third cassette guide 38. The controller 42 also stops the stepping motor 44 when the second limit position sensor 48 senses the arrival of the bracket 58 at a forward limit position or the first and second guide sensors 50 and 52 sense the presence of the wafer cassette 20 adjacent the second cassette guide 36 (indicative of the transfer of the cassette 20 to a designated position). Then, the controller 42 controls the stepping motor 44 to rotate the ball screw 56 in the other (reverse) direction, and stops the stepping motor 44 when the first limit position sensor 46 senses the arrival of the bracket 58 at a backward limit position.

Hence, the cassette moving section of the wafer cassette position control device comprises the stepping motor 44, the ball screw 56, the LM guide 54 that is integrated with the ball screw 56, and the first cassette guide 34 that is connected to the LM guide 54 and is moved by the LM guide 54 to guide the wafer cassette 20 to a designated position relative to the base plate 32. On the other hand, a control section of the wafer cassette position control device comprises the controller 40, the sensors/detectors operatively connected thereto, and the bracket 58.

A more detailed operation of the present invention will now be described referring to FIGS. 4 to 6.

First, a wafer cassette 20 is loaded onto the wafer cassette support 30 (step 101). In this respect, the wafer cassette 20 can transported by hand or by robot to the cassette support 30. Next, the controller 42 checks whether the photo sensor 62 has sensed the wafer cassette 20, i.e., has sensed the presence of the protrusion 62 of the cassette 20 within the guide recess 40 as an indicator of whether the cassette 20 is stably supported by the wafer cassette support 30 (step 102). If the wafer cassette 20 is not detected as being stably supported by the wafer cassette support 30, the controller 42 generates an alarm and stops the operation of equipment (step 103). On the other hand, if the wafer cassette 20 is detected as being stably supported by the wafer cassette support 30, the controller 42 drives the stepping motor 44 in a forward direction (step 104). As a result, the ball screw 56 rotates, thus moving the LM guide 54 and the first cassette guide 34 linearly in a first direction. At this time, the first cassette guide 34 guides the wafer cassette 20 towards the second cassette guide 36. The first and second guide sensors 50 and 52 installed on the second cassette guide 36 detect when the wafer cassette 20 arrives at the second cassette guide 36. Meanwhile, the controller 42 also monitors for the arrival of the bracket 58, connected to the LM guide 54, at a forward limit position as sensed by second limit position sensor 48 (step 105).

If the presence of the bracket 58 at the forward limit position is detected, the controller 42 generates an alarm and the stepping motor 44 is shut down (step 106). On the other hand, as long as the bracket 58 is not detected as being present at the forward limit position by the second limit position sensor 48, the controller 42 checks whether the wafer cassette 20 is adjacent the second cassette guide 36 as detected by the first and second guide sensors 50 and 52 (step 107). The controller 42 continues to monitor for the arrival of the bracket 58 at the first limit position as long as the wafer cassette 20 has not arrived at the second cassette guide 36 (step 105). Once the arrival of the wafer cassette 20 at the second cassette guide 36 has been detected, the stepping motor 44 is stopped (step 108). Then, the controller 42 initiates a timing operation to allow for a predetermined period of time, e.g., 2 seconds, to elapse (step 109). Once the predetermined period of time has elapsed, the controller 42 drives the stepping motor 44 in a reverse direction (step 110). As a result, a ball screw 56 is rotated in reverse, the LM guide 54 is moved horizontally, and the first cassette guide 34 is moved horizontally away from the second cassette guide 36. At this time, the controller 42 checks whether the bracket 58 connected to the first cassette guide 34 has arrived at a rearward position as sensed by the first limit position sensor 46 (step 111). Once the bracket 58 contacts the first limit position sensor 46, the controller 42 stops the stepping motor 44 (step 112). At this time, the cassette position control device assumes a stand-by state in which the wafer cassette 20 can be removed from the wafer support 30 and the next wafer cassette can be loaded onto the wafer support 30.

Though according to an exemplary embodiment of the invention, it was described above that a controller 42 sensed a loading of wafer cassette 20, a stepping motor 44 was driven so that the wafer cassette 20 became adhesive to a second cassette guide 36 by moving a first cassette guide 34, and a movement completion state was sensed by first and second guide sensors 50 and 52, thus the stepping motor 44 was stopped; according to another exemplary embodiment of the invention, a stepping motor 44 can be driven for a predetermined time and then stopped after sensing a loading of wafer cassette 20, thereby a position of wafer cassette 20 can be controlled, without deviating from a spirit of the invention. That is, instead of sensing a designated position of wafer cassette 20 through first and second guide sensors 50 and 52, a stepping motor 44 can be driven only for a predetermined time and then stopped.

According to the present invention as described above, a wafer cassette is loaded on a cassette support, and then is moved to a designated position. Thus, the wafers can always be loaded/unloaded to and from the same relative position by a robot (C/S ARM) or the like. Hence, the wafers can be prevented from being broken.

Finally, modifications and variations of the preferred embodiments present invention will be apparent to those skilled in the art. Thus, these and other changes and modifications are seen to be within the true spirit and scope of the invention as defined by the appended claims.

What is claimed is:

1. A wafer cassette support device for use in aligning a wafer cassette in semiconductor manufacturing equipment, the device comprising:
    a wafer cassette support including a base plate;
    a control section including a position sensor situated relative to the base plate so as to sense whether a wafer cassette is at a stably supported position on the base plate, and a controller operatively connected to the position sensor so as to generate and output a motor drive signal when the position sensor senses the presence of a wafer cassette at a stably supported position on the base plate; and
    a cassette moving section including a motor operatively connected to said controller so as to receive the motor drive signal therefrom and output a driving force when said signal is received, and a movable first wafer cassette guide connected to said motor so as to be driven by the driving force output by the motor.

2. The wafer cassette support device of claim 1, wherein said motor is a stepping motor having a rotary output shaft, and said cassette moving section further includes a ball screw connected to the output shaft of the stepping motor so as to be rotated thereby, and an LM (Linear Movement) guide engaged with the ball screw so as to convert rotational movement of the ball screw into linear movement, said movable cassette guide being connected to the LM guide so as to move along with the LM guide.

3. The wafer cassette support device of claim 2, wherein said control section further includes a bracket connected to the LM guide so as to move backwards and forwards therewith, a first limit position sensor situated relative to the bracket so as to sense when the bracket arrives at a rearward limit position, and a second limit position sensor situated relative to the bracket so as to sense when the bracket arrives at a forward limit position, said limit position sensors being operatively connected to said controller so as to issue signals to the controller indicative of the arrival of the bracket at the rearward and forward limit positions, respectively.

4. The wafer cassette support device of claim 1, wherein the position sensor comprises a cassette guide having a recess adapted to receive a protrusion extending from a bottom surface of the wafer cassette and a photosensor adapted to detect the presence of the protrusion in the recess.

5. A wafer cassette support device for use in aligning a wafer cassette in semiconductor manufacturing equipment, the device comprising:
    a wafer cassette support including a base plate on which a wafer cassette is to be supported;
    a stepping motor;
    a ball screw connected with the stepping motor so as to be selectively driven thereby in forward and reverse directions of rotation;
    an LM (Linear Movement) guide engaged with the ball screw so as to convert rotational movement of the ball screw into forward and rearward linear movement in conformity with the forward and reverse directions of rotation of the ball screw;
    a first cassette guide fixed to the LM guide so as to move forward and rearward therewith, said first cassette guide being engageable with a wafer cassette supported by the base plate of the cassette support such that the first cassette guide can move the wafer cassette along the base plate;
    a second cassette guide disposed in a fixed position relative to the base plate of the cassette support and spaced from the first cassette guide in the forward direction of movement thereof, the second cassette guide being engageable with a cassette as the cassette is being moved along the base plate of the cassette support by the first cassette guide so as to fix the cassette in position relative to the base plate;
    a photo sensor situated relative to the base plate of the cassette support so as to sense for the presence of a wafer cassette at a stably supported position on the base plate; and
    a controller operatively connected to the photo sensor and the stepping motor so as to drive the stepping when the photo sensor senses the presence of a wafer cassette at a stably supported position on the base plate of the cassette support.

6. The device of claim 5, and further comprising a bracket fixed to the LM guide so as to move therewith, and first and second limit position sensors situated relative to the bracket so as to sense when the bracket arrives at rearward and forward limit positions, respectively, said limit position sensors being operatively connected to said controller so as to issue signals to the controller indicative of the arrival of the bracket at the rearward and forward limit positions, respectively.

7. The device of claim 6, and further comprising at least one guide sensor disposed on the second cassette guide so as to detect the presence of a wafer cassette adjacent the second cassette guide.

8. A method of controlling the position of a wafer cassette in semiconductor manufacturing equipment, the method comprising:
    loading the wafer cassette onto a base plate of a wafer cassette support; and after the wafer cassette has been loaded onto the base plate of the wafer cassette support, driving a stepping motor in a forward direction to move a first cassette guide in the forward direction relative to the base plate while the first cassette guide is engaged with the wafer cassette and thereby move the wafer cassette along the base plate to a designated relative position.

9. The method of claim 8, and further comprising:

sensing whether the wafer cassette is stably supported by the base plate of the wafer cassette support after the wafer cassette has been loaded onto the base plate, and wherein the wafer cassette is moved by the first cassette guide to the designated relative position only once the wafer cassette is sensed as being stably supported on the base plate.

10. The method of claim 9, and further comprising:

sensing when the wafer cassette has arrived at the designated relative position; and stopping the operation of the stepping motor once the wafer cassette has been sensed at the designated relative position.

11. The method of claim 10, and further comprising:

initiating a counting operation once the wafer cassette has been sensed at the designated relative position, and driving the stepping motor to operate in a backward direction when the counting operation determines that a designated period of time has elapsed since the operation of the stepping motor has been stopped to thereby return the first cassette guide to an initial position.

12. The method of claim 8, and further comprising:

after loading the wafer cassette onto the base plate of the wafer cassette support and using a photosensor associated with the base plate, sensing whether the wafer cassette is stably supported by the base plate;

moving the wafer cassette by means of the first cassette guide to the designated relative position only after sensing that the wafer cassette is stably supported on the base plate;

using a plurality of guide sensors, sensing arrival of the wafer cassette at the designated relative position, and thereafter, stopping the operation of the stepping motor.

13. The method of claim 12, and further comprising:

initiating a counting operation upon sensing the wafer cassette at the designated relative position; and thereafter, driving the stepping motor to operate in a backward direction following a lapsed period of time determined by the counting operation to thereby return the first cassette guide to an initial position.

* * * * *